(12) United States Patent
Burski et al.

(10) Patent No.: US 11,755,078 B2
(45) Date of Patent: Sep. 12, 2023

(54) SOLID-STATE DRIVE WITH PRINTED CIRCUIT BOARDS COUPLED BY A FLEXIBLE INTERCONNECT

(71) Applicant: Seagate Technology LLC, Freemont, CA (US)

(72) Inventors: Brian Lee Burski, Loveland, CO (US); Ted R McDonald, Louisville, CO (US); Darrel R Culver, Frederick, CO (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 64 days.

(21) Appl. No.: 17/354,938

(22) Filed: Jun. 22, 2021

(65) Prior Publication Data

US 2022/0404881 A1  Dec. 22, 2022

(51) Int. Cl.

| H05K 1/18 | (2006.01) |
|---|---|
| G06F 1/18 | (2006.01) |
| G06F 1/30 | (2006.01) |
| H05K 1/11 | (2006.01) |
| H05K 7/14 | (2006.01) |
| H05K 1/14 | (2006.01) |

(52) U.S. Cl.
CPC .............. *G06F 1/187* (2013.01); *G06F 1/30* (2013.01); *H05K 1/118* (2013.01); *H05K 1/144* (2013.01); *H05K 7/1417* (2013.01)

(58) Field of Classification Search
CPC ........... G06F 1/187; G06F 1/30; H05K 1/118; H05K 1/144; H05K 7/1417

USPC ........................................................ 361/749
See application file for complete search history.

(56) References Cited

U.S. PATENT DOCUMENTS

| 4,741,327 | A | * | 5/1988 | Yabe ................... | A61B 1/00096 |
|---|---|---|---|---|---|
|  |  |  |  |  | 600/130 |
| 4,858,071 | A | * | 8/1989 | Manabe ............. | H05K 7/20854 |
|  |  |  |  |  | 361/720 |
| 5,274,570 | A | * | 12/1993 | Izumi ................. | H01R 13/6658 |
|  |  |  |  |  | 361/764 |
| 6,674,869 | B2 | * | 1/2004 | Paczkowski ......... | H04R 25/609 |
|  |  |  |  |  | 381/328 |
| 8,199,506 | B2 |  | 6/2012 | Janik et al. |  |
| 8,238,974 | B2 | * | 8/2012 | Lai .......................... | H05K 1/189 |
|  |  |  |  |  | 349/1 |
| 8,879,263 | B2 |  | 11/2014 | Gunderson |  |
| 9,383,795 | B2 |  | 7/2016 | Stenfort |  |
| 10,149,399 | B1 |  | 12/2018 | Mangay-Ayam, Jr. et al. |  |
| 2006/0067070 | A1 | * | 3/2006 | Otsuki ................. | H05K 9/0022 |
|  |  |  |  |  | 257/E21.705 |
| 2015/0159816 | A1 | * | 6/2015 | Preuschl ............... | F21V 19/003 |
|  |  |  |  |  | 362/249.02 |
| 2019/0236044 | A1 |  | 8/2019 | Rust et al. |  |

* cited by examiner

Primary Examiner — Binh B Tran (57) ABSTRACT

A solid-state drive (SSD) includes a first rigid printed circuit board comprising a surface that defines a first plane. A second rigid printed circuit board of the SSD comprises a surface that defines a second plane that is substantially parallel to the first plane. A flexible interconnect couples the first rigid printed circuit board and the second rigid printed circuit board. The flexible interconnect partially encloses a volume. A capacitor is disposed within the volume.

20 Claims, 6 Drawing Sheets

SOLID-STATE DRIVE WITH PRINTED CIRCUIT BOARDS COUPLED BY A FLEXIBLE INTERCONNECT

TECHNICAL FIELD

The disclosure relates to a solid-state drive (SSD) for data storage.

BACKGROUND

Solid-state drives (SSDs) often include capacitors to power the SSD and maintain stored data in the event of a temporary power loss. In one example, the capacitors provide enough power to enable the SSD to write data from a volatile memory or cache (e.g., random access memory (RAM)) to a non-volatile memory (e.g., NAND). The amount of data that can be written from volatile memory to non-volatile memory in the event of power loss is limited by the total capacitance provided by the capacitors.

SUMMARY

The present disclosure describes an example solid-state drive (SSD) that includes a plurality of rigid printed circuit boards (PCBs) disposed parallel to one another and coupled by a flexible interconnect. The flexible interconnect is positioned between the rigid PCBs. A volume is bound by and partially defined by an inner-facing surface of the flexible interconnect and outer edges of the rigid PCBs. A capacitor is disposed in the volume. Disposing a capacitor in the volume (e.g., as opposed to on a surface of a PCB) may, in some examples, provide more surface area on the PCB on which to dispose additional non-volatile memory devices (e.g., NAND), thus potentially increasing the amount of data that can be stored by the SSD. Additionally, placing a capacitor in the volume may enable larger capacitors to be used, which may increase the amount of electrical power available to the SSD and potentially enable the SSD to move larger amounts of data from volatile memory or cache to non-volatile memory in the event of a power failure. In some examples, placing a capacitor in the volume provides more flexibility in capacitor selection, such as enabling cheaper capacitors to be used and potentially reducing the manufacturing cost of an SSD.

In some examples, a solid-state drive comprises a first rigid printed circuit board comprising a surface that defines a first plane; a second rigid printed circuit board comprising a surface that defines a second plane that is substantially parallel to the first plane; a flexible interconnect coupling the first rigid printed circuit board and the second rigid printed circuit board, wherein the flexible interconnect partially encloses a volume; and a capacitor disposed within the volume.

These and other features and aspects of various examples may be understood in view of the following detailed discussion and accompanying drawings.

DETAILED DESCRIPTION

Figure 1:
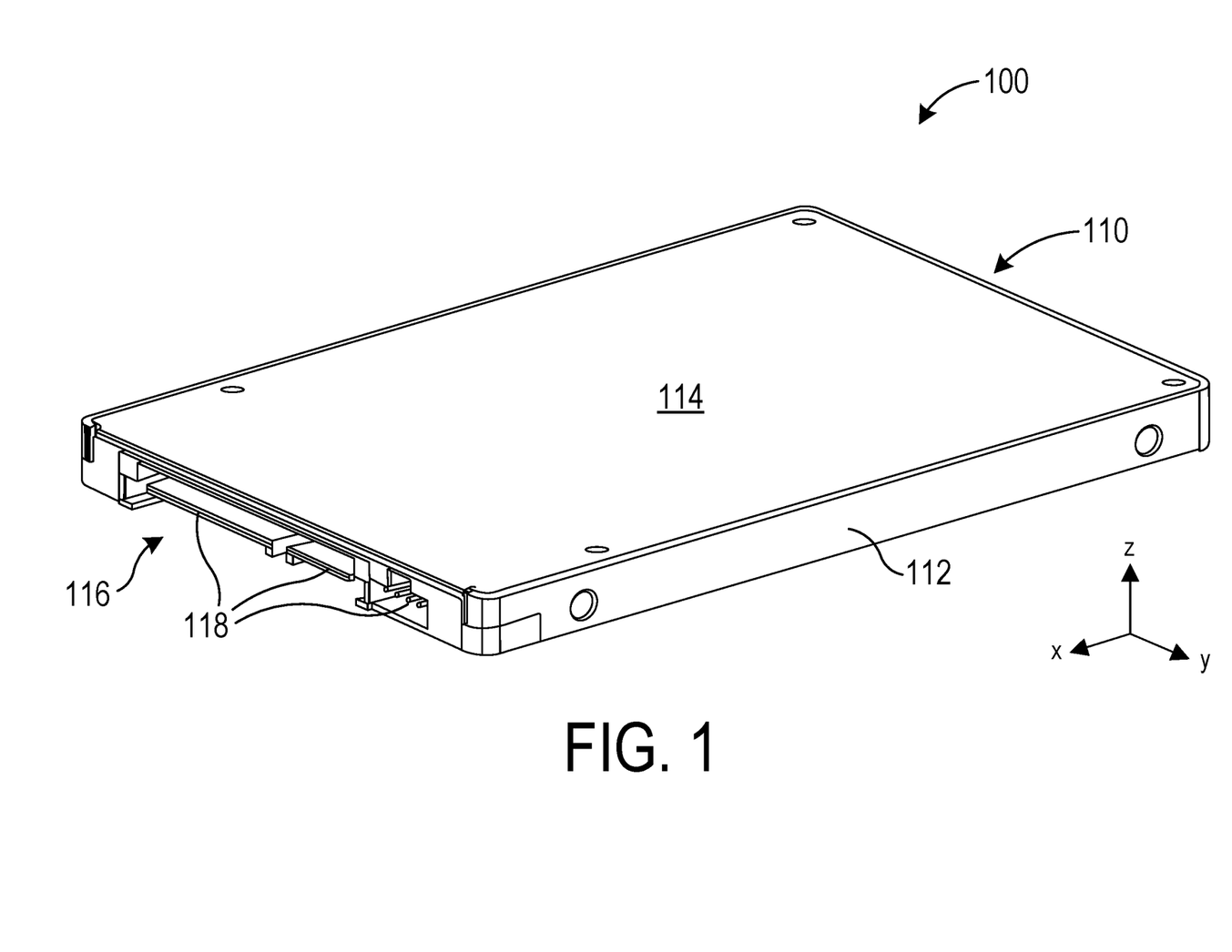
FIG. 1 is a perspective view of an example solid-state drive, in accordance with aspects of this disclosure.

FIG. 1 is a perspective view of an example solid-state drive (SSD), in accordance with aspects of this disclosure. SSD 100 is suitable for use in various applications, such as computing devices, portable electronic devices, data servers, or other devices that store data. SSD 100 differs from non solid-state drives, such as hard disk drives (HDDs), in that solid-state drive 100 typically does not have moving parts.

Solid-state drive 100 includes an outer housing 110. Outer housing 110 includes a frame 112, a top cover 114, a bottom cover (not shown in FIG. 1), and a plurality of input/output connectors 118 which are each configured to provide an interface with one or more host devices (e.g., a computer, a consumer electronic device, etc.). Frame 112 includes an opening 116 through which input/output connectors 118 can be accessed.

Outer housing 110 may be formed from any suitable material, such as metal (e.g., aluminum), plastic, or other suitable material or combinations thereof. Top cover 114 and the bottom cover can be mechanically connected to frame 112 using any suitable technique, such as using one or more screws, connection fingers, locking/clipping structures, adhesives, rivets, other mechanical fasteners, welding (e.g., ultrasonic welding) or combinations thereof. In the example of SSD 100 of FIG. 1, top cover 114 and the bottom cover are mechanically coupled to opposite sides of frame 112 to enclose one or more printed circuit boards (PCB), volatile memory (e.g., random access memory (RAM)), non-volatile memory (e.g., NAND), a controller or processor, among other components.

Figure 2:
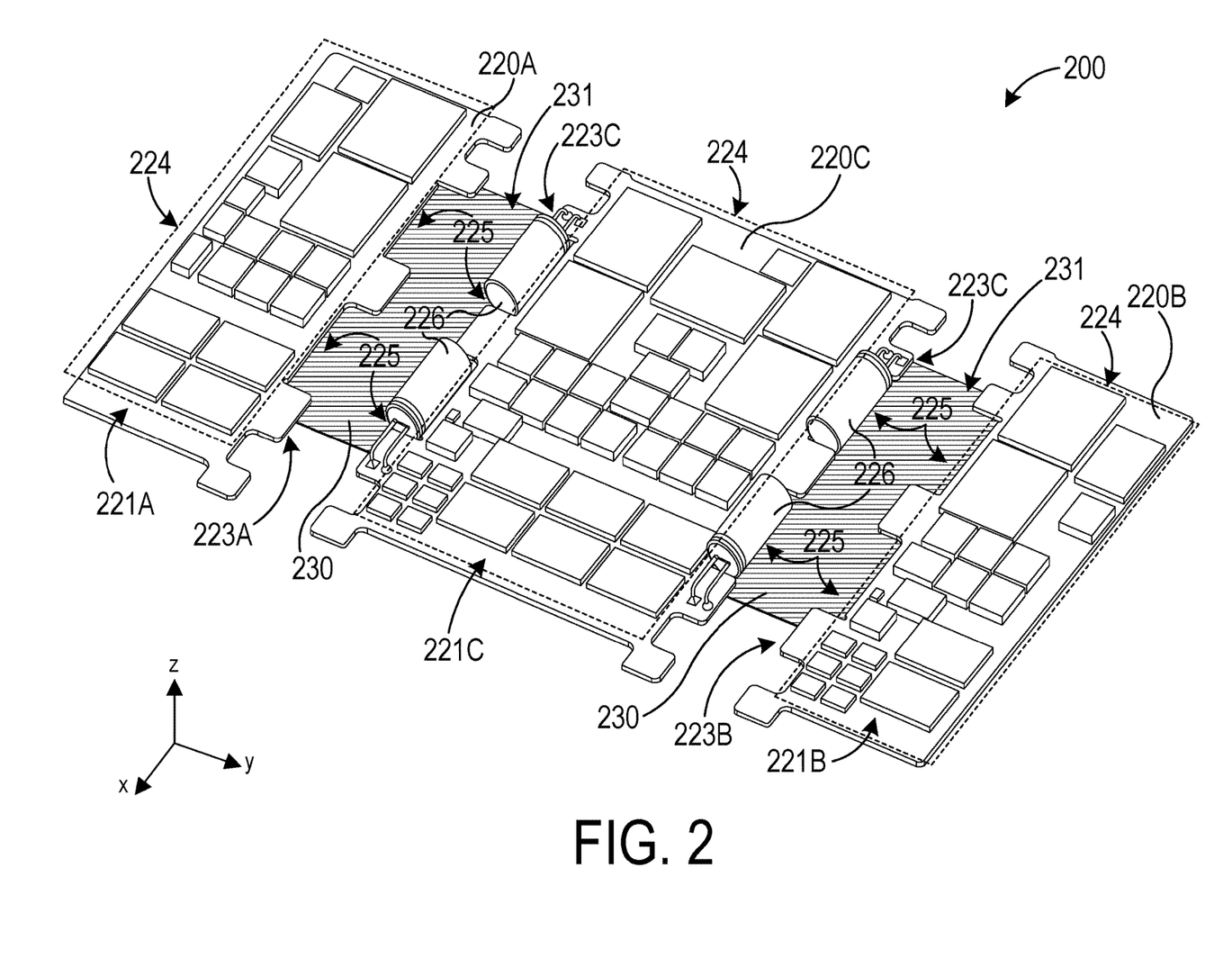
FIG. 2 is a perspective view of rigid printed circuit boards coupled by flexible interconnects in an example solid-state drive, in accordance with aspects of this disclosure.

FIG. 2 is a perspective view of rigid printed circuit boards (PCB) coupled by flexible interconnects in an example solid-state drive (e.g., SSD 100 of FIG. 1), in accordance with aspects of this disclosure. Solid-state drive 200 comprises rigid PCBs 220A, 220B, and 220C (collectively, rigid PCBs 220). Rigid PCB 220C may be a bottom PCB of SSD 200, and rigid PCBs 220A and 220B may be top PCBs of SSD 200.

Rigid PCBs 220 are configured to accommodate components, electric contacts, and/or electrical traces. Rigid PCBs 220 each include one or more layers of an insulating material and one or more layers of a conductive material. Examples of insulting materials of a rigid PCB 220 include composites such as synthetic resin bonded paper (e.g., FR-2) and glass-reinforced epoxy laminate (e.g., FR-4). An example of a conductive layer is copper (e.g., copper foil). In some instances, a layer of conductive material is patterned to form electrical traces which are configured to electrically couple two or more components.

Rigid PCBs 220A, 220B, and/or 220C may include a plurality of components 224 provided on surfaces 221A, 221B, and/or 221C, respectively. Examples of components 224 include active electrical components such as controller chips (e.g., microprocessors, application specific integrated circuits (ASICs), digital signal processors (DSPs)) and/or memory devices (e.g., non-volatile memory and/or volatile memory), and passive electrical components (e.g., capacitors, resistors). In some examples, a component 224 is surface mounted on a rigid PCB 220. In some examples, a component 224 is through-hole mounted on a rigid PCB 220. Two or more components 224 may be electrically coupled (e.g., electrically coupled by an electrical trace of a rigid PCB 220).

Flexible interconnects 230 couple rigid PCB 220A and rigid PCB 220B to PCB 220C. That is, a first portion of a flexible interconnect 230 may be coupled to a first rigid PCB 220, and a second portion of the flexible interconnect 230 may be coupled to a second rigid PCB 220. In some instances, a portion of a flexible interconnect 230 is soldered to a rigid PCB 220. Flexible interconnects 230 comprise a pliable material, such as a polymeric material. In some examples, a flexible interconnect 230 includes polyimide. A flexible interconnect 230 may include a plurality of electrical interconnects (not shown in FIG. 2) configured to carry electrical currents between components of two different rigid PCBs. That is, a flexible interconnect 230 may electrically couple two rigid PCBs 220 to one another. In some examples, a flexible interconnect 230 is soldered to one or more rigid PCBs 220.

In contrast to some SSDs that utilize laminated PCBs (e.g., flexible layers disposed between two rigid layers forming a single, continuous piece), coupling rigid PCBs via a separate flexible interconnect may reduce manufacturing cost of the SSD by potentially reducing the costs of the PCBs. That is, whereas laminated PCBs may have limited flexibility and/or dimensions, which may limit the ability to position and orient the rigid segments relative to one another and/or components in the SSD, techniques of the current disclosure may enable more design flexibility and/or reduced manufacturing costs. Additionally, coupling rigid PCBs with flexible interconnects may provide more versatility in positioning and orienting PCBs and/or components in the SSD.

SSD 200 includes one or more capacitors 226 configured to provide power to one or more components of SSD 200 (e.g., to temporarily power SSD 200 to prevent data loss in the event of a power failure). In some examples, capacitors 226 include wet electrolytic capacitors (e.g., liquid or gel electrolytes). In some examples, capacitors 226 include aluminum, tantalum, and/or niobium wet electrolytic capacitors. In one example, capacitors 226 include aluminum electrolytic capacitors. In contrast to example SSDs that include solid electrolytic capacitors, such as polymer tantalum electrolytic capacitors, utilizing wet electrolytic capacitors may decrease manufacturing costs of SSD 200 (e.g., compared to utilizing solid electrolytic capacitors such as polymeric electrolytic capacitors).

In some examples, SSD 200 includes at least one capacitor 226 disposed adjacent to rigid PCBs 220 along edges of one or both rigid PCBs 220. In the example of FIG. 2, rigid PCB 220C includes a plurality of capacitors 226 disposed adjacent to one or more edges 223C. In contrast to example SSDs that include capacitors on the surfaces of PCBs, disposing capacitors 226 along the edges of a rigid PCB may provide more surface area for other components to be provided on surfaces of the rigid PCB. In some instances, the additional surface area provided on surfaces 221A, 221B, and/or 221C (collectively, surfaces 221) by disposing capacitors along edges of their respective rigid PCBs may enable more memory devices to be provided on these surfaces, thus increasing the storage capacity of SSD 200.

One or more of rigid PCBs 220 may include recesses 225 along an edge of the respective PCB 220. In some examples, one or more capacitors 226 are disposed within recesses 225. Disposing capacitors 226 within recesses 225 may enable SSD 200 to utilize relatively large capacitors (e.g., wet electrolytic capacitors) compared to SSDs that include capacitors on the surface of the PCBs.

In the example of SSD 200 of FIG. 2, the pliability of flexible interconnects 230 enables them to be shaped, bent, folded, wrapped, or otherwise positioned around capacitors 226 in the process of arranging rigid PCBs 220 of SSD 200. Flexible interconnects 230 may be positioned such that a volume in which a capacitor 226 of SSD 200 is disposed in the final arrangement is partially enclosed by a surface 231 of a flexible interconnect 230. In this way, the inclusion of flexible interconnects 230 instead of rigid-flex PCBs serves as another aspect of the design of SSD 200 that enables it to accommodate larger capacitors than other SSD designs. Using flexible interconnects 230 may provide additional space to dispose more memory devices and/or other components on surfaces 221 of rigid PCBs 220. Such enablement provided by the SSD configuration depicted in FIG. 2 may provide cost and/or capacity benefits to SSD 200.

In some examples, capacitors 226 are coupled to rigid PCB 220C and are positioned in recesses 225 along edges 223C. Opposite ends (not shown in FIG. 2) of flexible interconnects 230 may be coupled to bottom surfaces (not shown in FIG. 2) of the rigid PCBs 220 that they are coupling, where a bottom surface of PCB 220A, 220B, and 220C is on a face of the PCB which is opposite and substantially parallel to surfaces 221A, 221B, and 221C, respectively. In some examples, opposite ends of flexible interconnects 230 are electrically coupled to the bottom surfaces of rigid PCBs 220A, 220B, and 220C.

Rigid PCBs 220A, 220B, and 220C may be arranged in a configuration, such as in a vertically stacked configuration, that enables them to be disposed in a housing (e.g., outer housing 110 of FIG. 1). For example, surface 221A of rigid PCB 220A may be moved and rotated along a circumferential, clockwise path in a y-z plane. Surface 221A may be moved and rotated until it faces and is substantially parallel to surface 221C of rigid PCB 220C. After positioning rigid PCB 220A in this manner, the bottom surface of rigid PCB 220A (e.g., the surface to which an end of flexible interconnect 230 is coupled) is substantially parallel to an x-y plane and faces a positive z-direction. This positioning of rigid PCB 220A relative to rigid PCB 220C results in the flexible interconnect 230 coupling rigid PCB 220A and rigid PCB 220C bending in a manner such that a portion of the flexible interconnect 230 partially enwraps the capacitors 226 which are disposed along the edge 223C between rigid PCB 220C and rigid PCB 220A. The resultant arrangement thus includes rigid PCB 220A and rigid PCB 220C provided in a stacked configuration, with rigid PCB 220A positioned above rigid PCB 220C in the z-direction. After positioning rigid PCB 220A in this arrangement, surface 221A faces and is substantially parallel to surface 221C. In this arrangement, capacitors 226 are disposed adjacent to edge 223C and edge 223A. Capacitors 226 are partially enclosed in a volume which is partially defined by surface 231 of the flexible interconnect 230 coupling rigid PCB 220C and rigid PCB 220A.

Likewise, surface 221B of rigid PCB 220B may be moved and rotated along a circumferential, counterclockwise path in a y-z plane. Surface 221B may be moved and rotated until it faces and is substantially parallel to surface 221C of rigid PCB 220C. After positioning rigid PCB 220B in this manner, the bottom surface of rigid PCB 220B (e.g., the surface of rigid PCB 220B to which an end of flexible interconnect 230 is coupled) is substantially parallel to an x-y plane and faces a positive z-direction. This positioning of rigid PCB 220B relative to rigid PCB 220C results in the flexible interconnect 230 coupling rigid PCB 220B and rigid PCB 220C bending in a manner such that a portion of the flexible interconnect 230 enwraps the capacitors 226 which are disposed along the edge 223C between rigid PCB 220C and rigid PCB 220B. After positioning in this arrangement, rigid PCB 220B is positioned above rigid PCB 220C in the z-direction, with surface 221B facing and substantially parallel to surface 221C. The resultant arrangement thus includes rigid PCB 220B and rigid PCB 220C provided in a stacked configuration. In this arrangement, capacitors 226 are adjacent to edges 223C and 223B. Capacitors 226 in this arrangement are partially enclosed in a volume that is partially defined by surface 231 the flexible interconnect 230 coupling rigid PCB 220B and rigid PCB 220C.

Figure 3A:
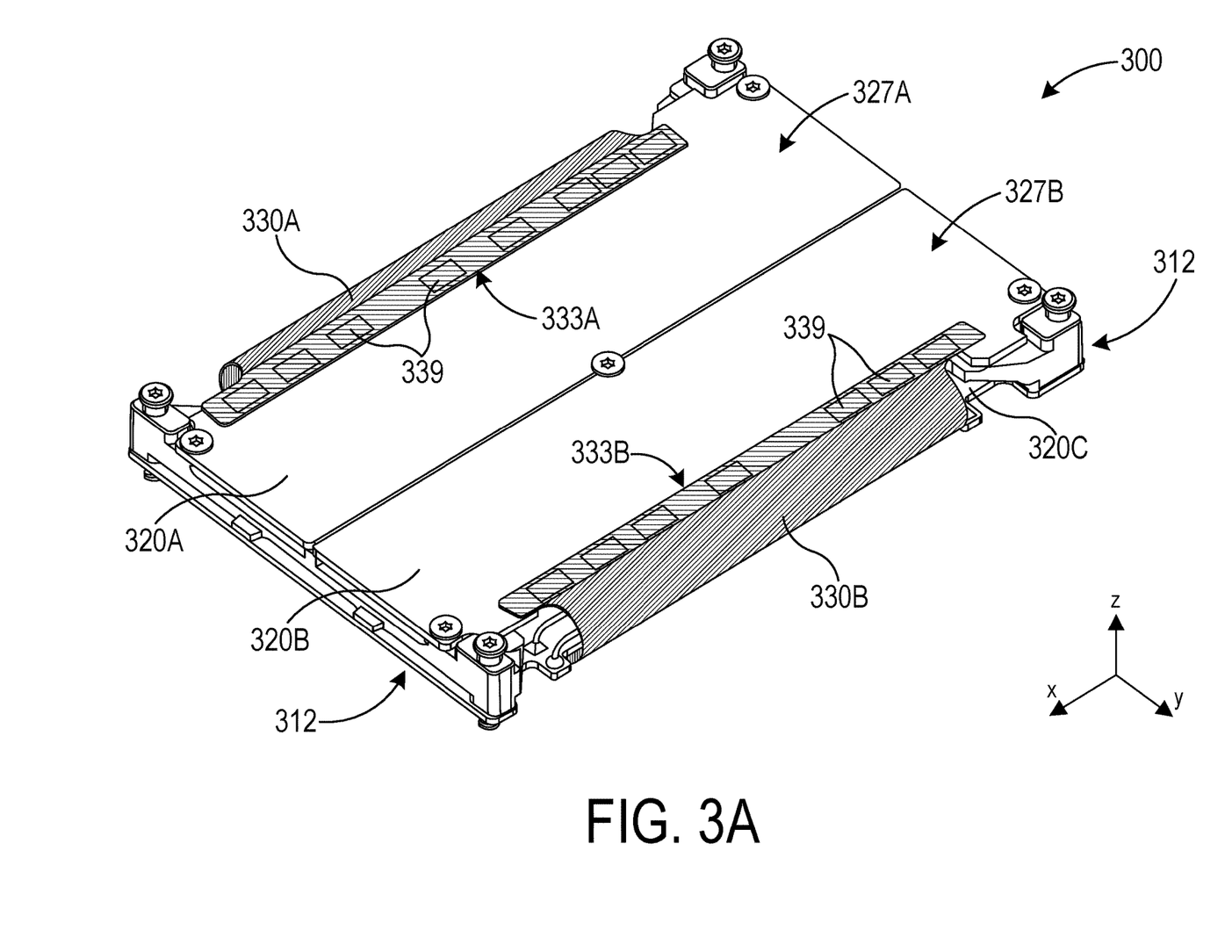
FIG. 3A is a perspective view of components of an example solid-state drive, in accordance with aspects of this disclosure.
Figure 3B:
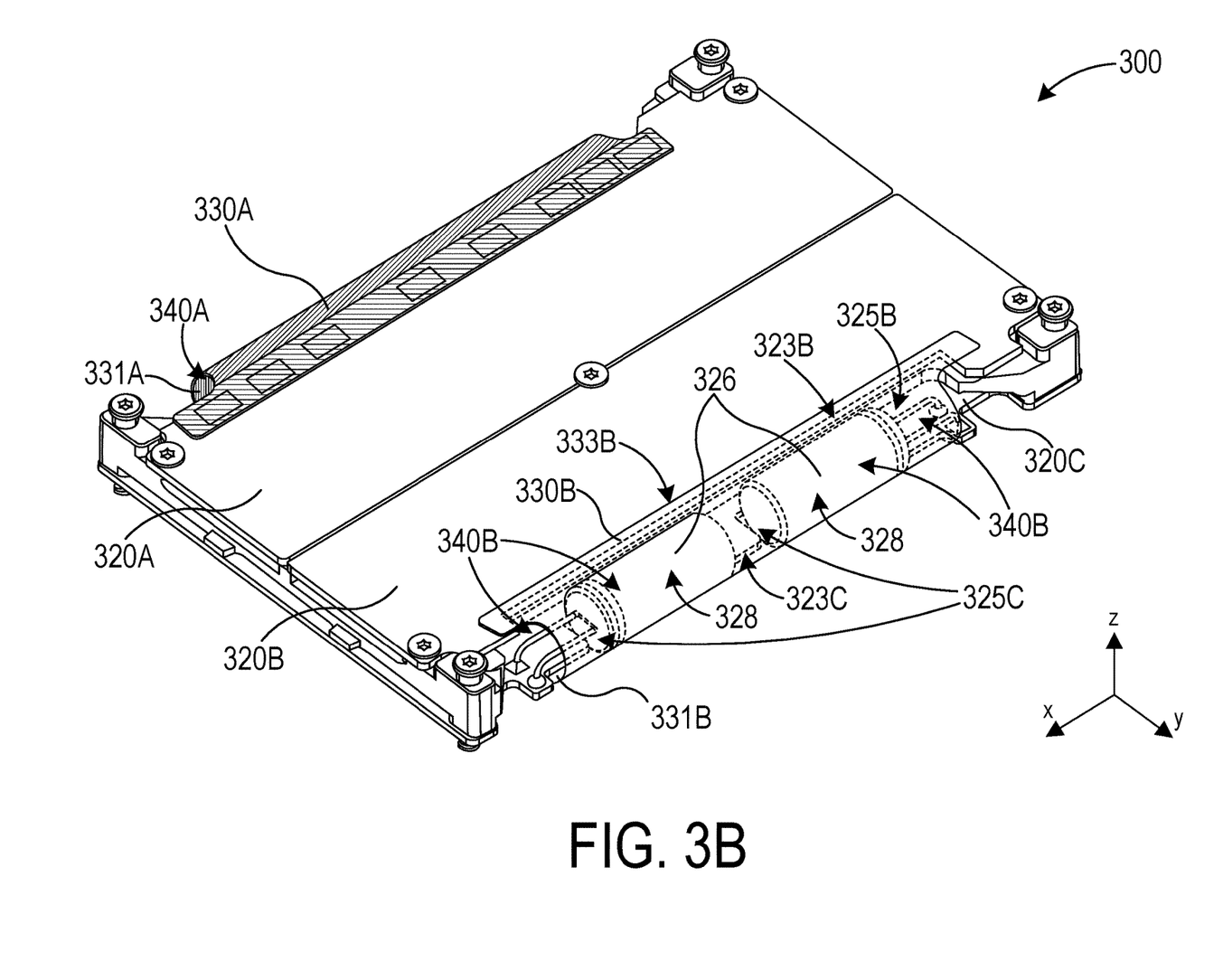
FIG. 3B is a perspective view of components of an example solid-state drive, in accordance with aspects of this disclosure.

FIGS. 3A and 3B are perspective views of components of an example SSD, in accordance with aspects of this disclosure. SSD 300 may be an example of SSD 200 of FIG. 2. SSD 300 comprises rigid PCBs 320A, 320B, and 320C (collectively, rigid PCBs 320) coupled to parts of a frame 312. Rigid PCBs 320 are arranged in a stacked configuration, with rigid PCBs 320A and 320B presented above, in the z-direction, and substantially parallel to rigid PCB 320C.

Flexible interconnect 330A couples rigid PCBs 320A and 320C. Flexible interconnect 330B couples rigid PCBs 320B and 320C. Flexible interconnects 330A and 330B (collectively, flexible interconnects 330) comprise a pliable material, such as a polymeric material. In some examples, a flexible interconnect 330 includes polyimide. Ends 333A and 333B of flexible interconnects 330A and 330B are coupled to surfaces 327A and 327B of rigid PCBs 320A and 320B, respectively. Opposite ends of flexible interconnects 330A and 330B are coupled to one or more bottom surfaces of rigid PCB 320C, where a bottom surface of rigid PCB 320C is substantially parallel to surfaces 327A and 327B. Flexible interconnects 330 may include a plurality of electrical interconnects 339 configured to electrically couple traces and/or components of rigid PCBs 320 and carry electrical currents between components of rigid PCBs 320.

As illustrated in FIG. 3B, flexible interconnects 330 partially enclose volumes 340A and 340B (collectively, volumes 340). Flexible interconnect 330B, for example, is arranged in a way in which it includes a curvature that partially encloses volume 340B, Capacitors 326 are disposed in volume 340B. Examples of capacitors 326 include aluminum, tantalum, and/or niobium wet electrolytic capacitors. While FIG. 3B illustrates a capacitor 326 disposed within a volume 340, in some examples, SSD 300 incudes other types of passive components e resistors, other types of capacitors) or active components (e.g., memory devices, controllers) disposed within volume 340.

Flexible interconnect 330B includes an inner surface 331B that faces rigid PCBs 320B and 320C. Rigid PCBs 320B and 320C each include edges 323B and 323C, respectively. Edge 323B may be substantially parallel to edge 323C. Volume 340B is partially defined by inner surface 331B of flexible interconnect 330B, edge 323B of rigid PCB 320B, and edge 323C of rigid PCB 320C. Likewise, volume 340A may be partially defined by a similar inner surface 331A of flexible interconnect 330A and edges of rigid PCBs 320A and 320C.

In some examples, inner surfaces 331A and/or 331B of flexible interconnects 330 may conform to an outer surface of a capacitor 326. In such examples, a shape and contour of a volume 340 is partially defined by a shape and profile of a capacitor 326 which it encloses. In other words, the shape and contour of a volume 340 may match the shape and contour of a capacitor 326 which it encloses. For example, capacitors 326 may be substantially cylindrical and may be disposed in a volume 340 which is substantially semi-cylindrical. In one example, volume 340B is partially defined by a semi-cylindrical part of surface 331B which faces a capacitor 326. The capacitor 326 of this example may have a cylindrical circumferential outer surface 328. The semi-cylindrical part of surface 331B of flexible interconnect 330B may physically contact and partially conform to outer surface 328 of capacitor 326, thus enclosing substantially cylindrical capacitor 326 in a substantially semi-cylindrical volume 340B.

Edge 323C of rigid PCB 320C may include one or more recesses 325C. A capacitor 326 may be coupled to rigid PCB 320B and/or 320C and positioned in a recess 325C. In such examples, volume 340B in which the capacitor 326 is disposed is partially defined by recess 325C.

Edge 323B of rigid PCB 320B may include one or more recesses 325B. In some examples, part of a capacitor 326 is disposed in a recess 325B. In such examples, volume 340B is partially defined by a recess 325B. In one example, edge 323B is substantially parallel to edge 323C of rigid PCB 320C, and a recess 325B is substantially parallel to a recess 325C of rigid PCB 320C, with each recess substantially parallel to an x-y plane. A capacitor 326 may be coupled to rigid PCB 320B and/or 320C, and parts of capacitor 326 may be disposed within recesses 325B and 325C. Volume 340B of this example is partially defined by recesses 325B and 325C.

Figure 4A:
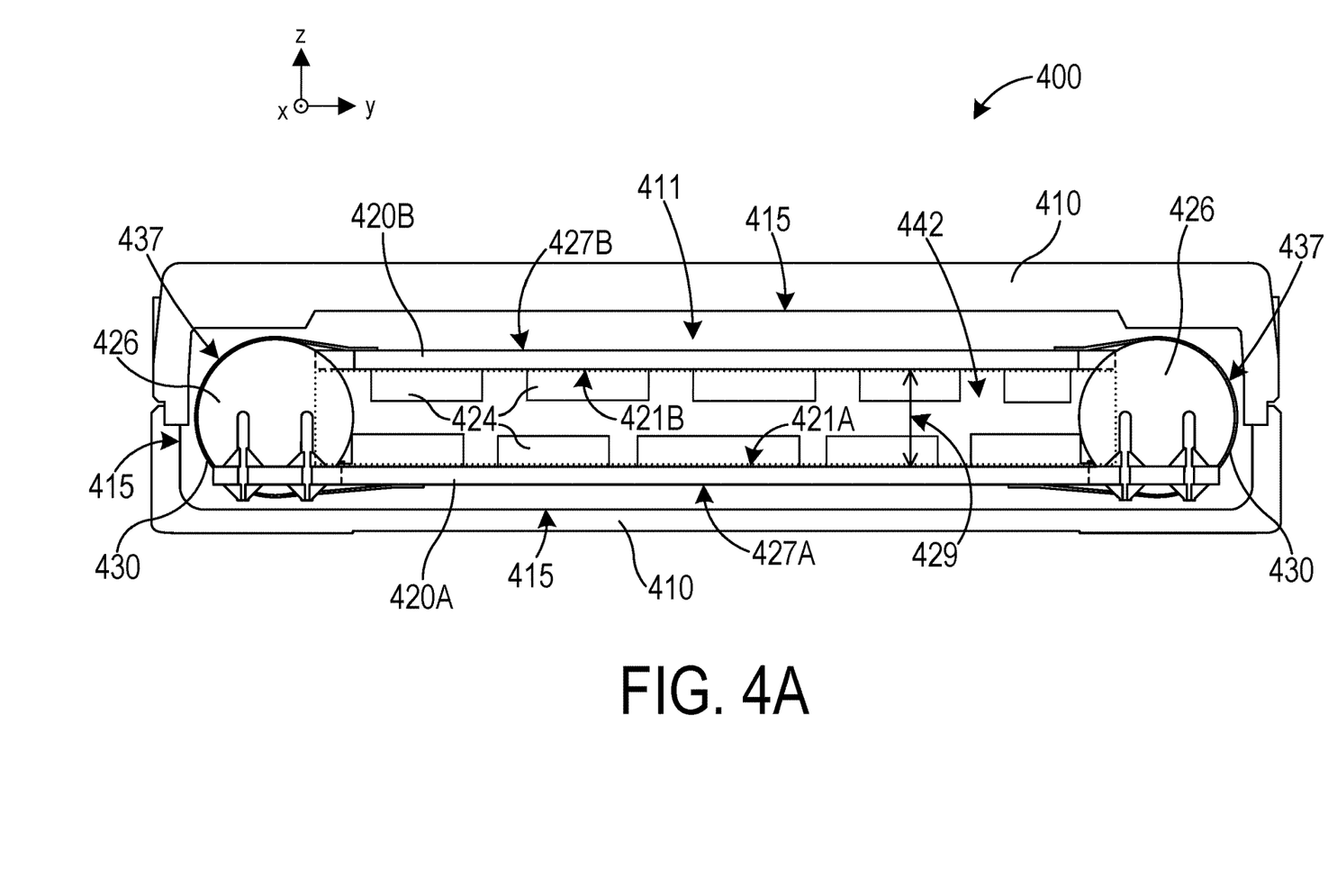
FIG. 4A is a cross-sectional interior view of a portion of an example solid-state drive, in accordance with aspects of this disclosure.

FIG. 4A is a cross-sectional interior view of a portion of an example solid-state drive, in accordance with aspects of this disclosure. SSD 400 may be an example of SSD 200 of FIG. 2. SSD 400 includes a rigid PCB 420A and a rigid PCB 420B coupled by flexible interconnects 430. Capacitors 426 are coupled to rigid PCB 420A. The assembly of rigid PCBs 420A and 420B, flexible interconnects 430, and capacitors 426 of SSD 400 are provided in an interior volume 411 enclosed by an outer housing 410. Outer housing 410 includes inner surfaces 415 which face the assembly. Outer surfaces 437 of flexible interconnects 430 face inner surfaces 415 of outer housing 410.

Flexible interconnects 430 are bent to position rigid PCB 420A and rigid PCB 420B in a stacked configuration. Rigid PCB 420B is presented above, in the z-direction, and substantially parallel to rigid PCB 420A. Rigid PCB 420A includes an outer surface 427A and an inner surface 421A. Rigid PCB 420B includes an inner surface 421B and an outer surface 427B. Surfaces 427A, 421A, 421B, and 427B are all substantially parallel to each other, and are substantially parallel to an x-y plane.

Inner surface 421A defines a first plane. Inner surface 421B defines a second plane that is substantially parallel to the first plane. A gap 429 between the first plane defined by inner surface 421A and the second plane defined by inner surface 421B is defined by a non-zero length in a dimension which is substantially perpendicular to the first plane and the second plane (e.g., the z-dimension in the example of FIG. 4A). A portion of a volume 442 is defined by gap 429 and the x-y dimensional areas of inner surfaces 421A and 421B. Volume 442 is occupied by components 424 of rigid PCBs 420A and 420B.

Figure 4B:
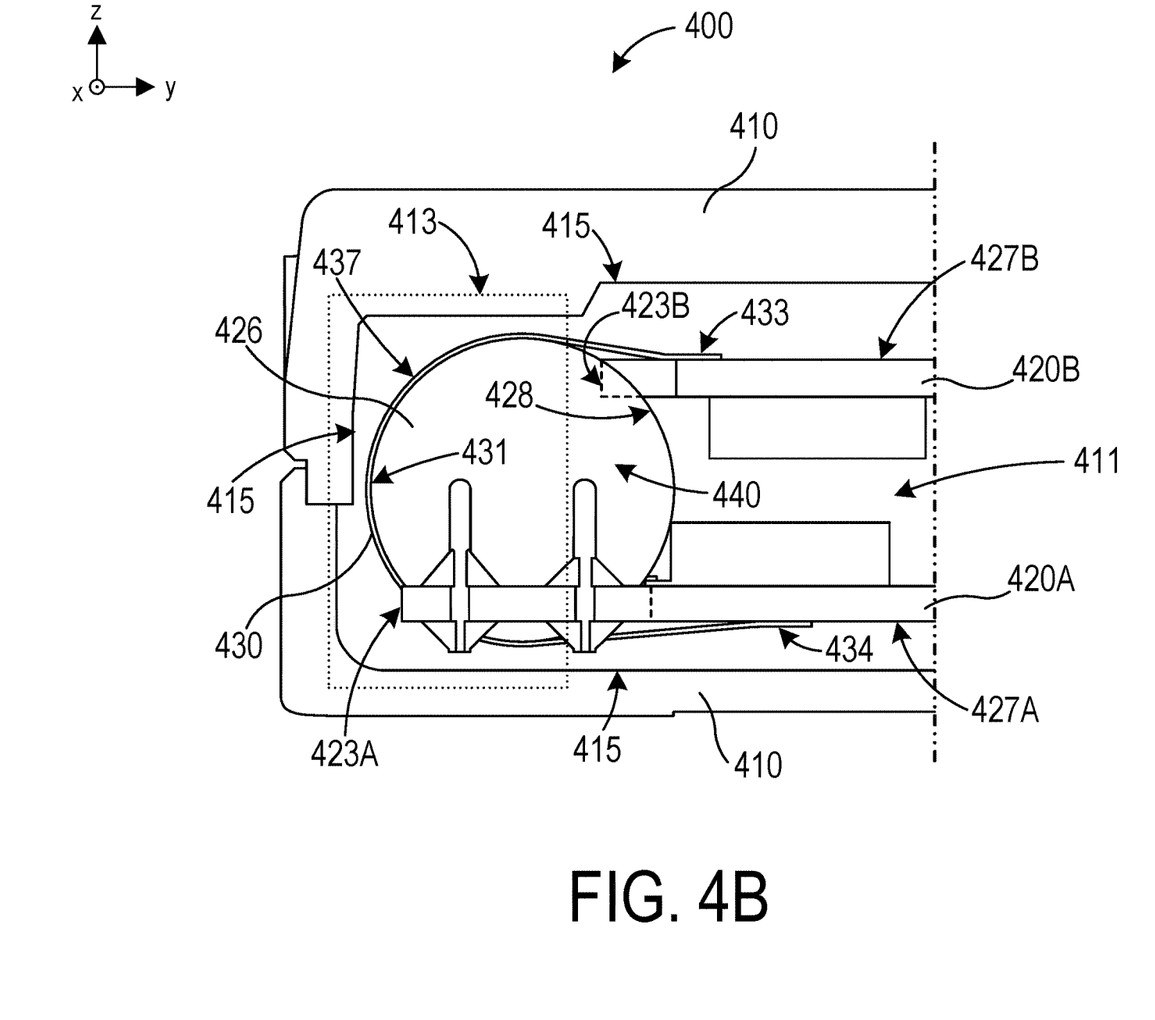
FIG. 4B is a cross-sectional interior view of a portion of an example solid-state drive, in accordance with aspects of this disclosure.

FIG. 4B is a cross-sectional interior view of a portion of an example solid-state drive, in accordance with aspects of this disclosure. SSD 400 may be an example of SSD 400 of FIG. 4A. SSD 400 includes a rigid PCB 420A and a rigid PCB 420B coupled by a flexible interconnect 430. A capacitor 426 is coupled to rigid PCB 420A and disposed in a volume 440. Volume 440 is partially defined by rigid PCB 420A, rigid PCB 420B, and flexible interconnect 430. The assembly of rigid PCBs 420A and 420B, flexible interconnect 430, and capacitor 426 of SSD 400 are provided in an interior volume 411 that is enclosed by an outer housing 410. Outer housing 410 includes inner surfaces 415 that face the assembly. Outer surfaces 437 of flexible interconnects 430 face inner surfaces 415 of outer housing 410.

Flexible interconnect 430 is positioned with a curvature such that the curvature partially conforms to the shape of outer housing 410 and partially defines volume 440. In some examples, the curvature of flexible interconnect 430 is partially defined by an inner surface 431 of flexible interconnect 430. Inner surface 431 faces interior volume 411 and rigid PCBs 420A and 420B.

An end 433 of flexible interconnect 430 is coupled to an outer surface 427B of rigid PCB 420B. An opposite end 434 of flexible interconnect 430 is coupled to an outer surface 427A of rigid PCB 420A. End 433 of flexible interconnect 430 may be parallel to and opposite end 434 of flexible interconnect 430 when flexible interconnect 430 is unfolded and provided in a flat arrangement. Ends 433 and 434 of flexible interconnect 430 may be coupled to parts of outer surfaces 427A and 427B that are proximate to edges 423A and 423B of rigid PCBs 420A and 420B, respectively.

A shape and profile of volume 440 may be partially defined by a shape and profile of capacitor 426. For example, capacitor 426 may be substantially cylindrical, and volume 440 in which capacitor 426 is disposed may be substantially semi-cylindrical. Volume 440 may be partially defined by a semi-cylindrical part of inner surface 431 of flexible interconnect 430. Flexible interconnect 430 may be arranged such that a curvature of flexible interconnect 430 conforms to the cylindrical shape of capacitor 426, and a part of surface 431 of flexible interconnect 430 physically contacts and conforms to a part of an outer surface 428 of capacitor 426. Thus, the semi-cylindrical part of surface 431 of flexible interconnect 430 partially encloses substantially cylindrical capacitor 426 in substantially semi-cylindrical volume 440.

Volume 413 is a portion of volume 411 which is proximate to one or more inner surfaces 415 of outer housing 410. In the example of SSD 400, volume 413 overlaps with volume 440 in which capacitor 426 is disposed. That is, capacitor 426 occupies a portion of inner volume 411 which is proximate to outer housing 410. In some instances, disposing a capacitor of an SSD in a volume which is proximate to an outer housing may enable larger capacitors to be used than in example SSDs where capacitors are not disposed near an outer housing of the SSD. Coupling rigid PCBs with flexible interconnects which are positioned to be semi-conformal to an outer housing, providing features such as recesses in the rigid PCBs, and arranging the rigid PCBs and flexible interconnects may provide a volume proximate to the outer housing which is sufficiently large to accommodate capacitors which are too large to dispose on surfaces of the PCBs (e.g., inner surfaces 421A and 421B of FIG. 4A). In some instances, disposing a one or more capacitors the volume provided by the rigid PCBs and the flexible interconnect may reduce the cost and/or increase the capacity of an SSD by enabling more flexibility in capacitor selection.

What is claimed is:

1. A solid-state drive comprising:
   a first rigid printed circuit board comprising a surface that defines a first plane, wherein the first rigid printed circuit board comprises a first edge;
   a second rigid printed circuit board comprising a surface that defines a second plane that is substantially parallel to the first plane, wherein the second rigid printed circuit board comprises a second edge;
   a flexible interconnect coupling the first rigid printed circuit board adjacent the first edge and the second rigid printed circuit board adjacent the second edge, wherein the flexible interconnect partially encloses a volume; and
   a capacitor disposed within the volume and adjacent the first edge and the second edge,
   wherein the flexible interconnect is contoured in a manner such that a portion of the flexible interconnect partially enwraps the capacitor.

2. The solid-state drive of claim 1,
   wherein the flexible interconnect includes a curvature, and
   wherein the curvature of the flexible interconnect partially encloses the volume.

3. The solid-state drive of claim 2, wherein the curvature is partially defined by a surface of the flexible interconnect, and wherein an end of the flexible interconnect is coupled to the surface of the first rigid printed circuit board.

4. The solid-state drive of claim 3, wherein the end of the flexible interconnect is a first end, and wherein a second end of the flexible interconnect is coupled to the surface of the second rigid printed circuit board.

5. The solid-state drive of claim 1,
   wherein the first edge of the first rigid printed circuit board comprises a recess, and
   wherein the capacitor is disposed within the recess.

6. The solid-state drive of claim 5,
   wherein the second edge of the second rigid printed circuit board comprises a recess that is substantially parallel to the recess of the first edge of the first rigid printed circuit board, and
   wherein the capacitor is further disposed within the recess of the second edge of the second rigid printed circuit board.

7. The solid-state drive of claim 1,
   wherein the flexible interconnect comprises an inner surface which faces the first and second rigid printed circuit board,
   and
   wherein the volume is partially defined by the inner surface of the flexible interconnect, the first edge of the first rigid printed circuit board, and the second edge of the second rigid printed circuit board.

8. The solid-state drive of claim 7,
   wherein the first edge of the first rigid printed circuit board comprises a plurality of recesses, and
   wherein the volume is further partially defined by the plurality of recesses.

9. The solid-state drive of claim 8,
   wherein the second edge of the second rigid printed circuit board comprises a plurality of recesses, and
   wherein the volume is further partially defined by the plurality of recesses of the second edge of the second rigid printed circuit board.

10. The solid-state drive of claim 7,
wherein the flexible interconnect further comprises a first end substantially parallel to and opposite a second end of the flexible interconnect,
wherein the first end of the flexible interconnect is coupled to a part of the surface of the first rigid printed circuit board which is proximate to the first edge of the first rigid printed circuit board, and
wherein the second end of the flexible interconnect is coupled to a part of the surface of the second rigid printed circuit board which is proximate to the second edge of the second rigid printed circuit board.

11. The solid-state drive of claim 7 further comprising an outer housing which is configured to enclose the first rigid printed circuit board, the second rigid printed circuit board, the flexible interconnect, and the capacitor,
wherein the outer housing comprises a plurality of inner surfaces,
wherein the flexible interconnect further comprises an outer surface, and
wherein the outer surface of the flexible interconnect faces at least one of the plurality of inner surfaces of the outer housing.

12. The solid-state drive of claim 1, wherein the flexible interconnect comprises a plurality of electrical interconnects.

13. The solid-state drive of claim 1,
wherein the coupling of the flexible interconnect to the first rigid printed circuit board and the second rigid printed circuit board comprises electrical coupling.

14. The solid-state drive of claim 1, wherein a gap between the first plane defined by the surface of the first rigid printed circuit board and the second plane defined by the surface of the second rigid printed circuit board is defined by a non-zero length in a dimension which is substantially perpendicular to the first plane and the second plane.

15. The solid-state drive of claim 1, wherein the capacitor is a wet electrolytic capacitor.

16. The solid-state drive of claim 15, wherein the capacitor is an aluminum wet electrolytic capacitor.

17. The solid-state drive of claim 1, wherein the flexible interconnect comprises polyimide.

18. The solid-state drive of claim 1, wherein the first rigid printed circuit board and/or the second rigid printed circuit board comprises synthetic resin bonded paper and/or glass-reinforced epoxy laminate.

19. A solid-state drive comprising:
a first rigid printed circuit board comprising a surface that defines a first plane;
a second rigid printed circuit board comprising a surface that defines a second plane that is substantially parallel to the first plane;
a flexible interconnect coupling the first rigid printed circuit board and the second rigid printed circuit board, wherein the flexible interconnect partially encloses a volume; and
a capacitor disposed within the volume,
wherein a shape and contour of the volume is partially defined by a shape and profile of the capacitor, and
wherein the flexible interconnect is arranged such that a part of a surface of the flexible interconnect conforms to a part of an outer surface of the capacitor.

20. The solid-state drive of claim 19,
wherein the flexible interconnect includes a curvature that partially encloses the volume,
wherein the curvature is partially defined by a surface of the flexible interconnect,
wherein a first end of the flexible interconnect is coupled to the surface of the first rigid printed circuit board, and
wherein a second end of the flexible interconnect is coupled to the surface of the second rigid printed circuit board.

* * * * *